United States Patent
Song et al.

(10) Patent No.: US 10,051,741 B2
(45) Date of Patent: Aug. 14, 2018

(54) EMBEDDED LAYERED INDUCTOR

(71) Applicant: QUALCOMM Incorporated, San Diego, CA (US)

(72) Inventors: Young Kyu Song, San Diego, CA (US); Daeik Daniel Kim, San Diego, CA (US); Xiaonan Zhang, San Diego, CA (US); Ryan David Lane, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 286 days.

(21) Appl. No.: 14/073,756

(22) Filed: Nov. 6, 2013

(65) Prior Publication Data
US 2015/0124418 A1    May 7, 2015

(51) Int. Cl.
H05K 1/18 (2006.01)
H05K 1/16 (2006.01)
H05K 1/14 (2006.01)

(52) U.S. Cl.
CPC ............ *H05K 1/165* (2013.01); *H05K 1/141* (2013.01); *H05K 2201/10378* (2013.01)

(58) Field of Classification Search
CPC ............ H05K 3/4617; H01F 17/0013; H01L 23/5227
USPC .................. 361/763–766, 782–785, 792–795; 336/199–200; 257/531
See application file for complete search history.

(56) References Cited

U.S. PATENT DOCUMENTS

| | | | | |
|---|---|---|---|---|
| 5,373,112 A * | 12/1994 | Kamimura | .......... | H01F 17/0006 174/250 |
| 5,610,433 A * | 3/1997 | Merrill | .............. | H01F 17/0013 257/531 |
| 6,878,633 B2 | 4/2005 | Raskin et al. | | |
| 6,879,234 B2 * | 4/2005 | Furumiya | .............. | H03B 5/124 257/E27.046 |
| 7,262,680 B2 * | 8/2007 | Wang | ................. | H01F 17/0013 257/531 |
| 7,400,025 B2 * | 7/2008 | Pitts | .................... | H01F 17/0013 257/531 |
| 8,089,163 B2 | 1/2012 | Tanida et al. | | |
| 8,101,866 B2 | 1/2012 | Hsu | | |
| 8,143,987 B2 * | 3/2012 | Kireev | ............... | H01L 23/5227 336/200 |
| 8,456,003 B2 | 6/2013 | Lee et al. | | |
| 2006/0284719 A1 * | 12/2006 | Lee | .................... | H01F 17/0013 336/223 |
| 2008/0303622 A1 * | 12/2008 | Park | .................... | H01F 17/0013 336/200 |
| 2009/0146770 A1 * | 6/2009 | Lee | .................... | H01F 17/0006 336/200 |
| 2009/0200675 A1 | 8/2009 | Goebel et al. | | |
| 2010/0109123 A1 * | 5/2010 | Strzalkowski | ...... | H01F 17/0013 257/531 |

(Continued)

*Primary Examiner* — Tuan T Dinh
(74) *Attorney, Agent, or Firm* — Muncy, Geissler, Olds & Lowe

(57) ABSTRACT

An embedded layered inductor is provided that includes a first inductor layer and a second inductor layer coupled to the first inductor layer. The first inductor layer comprises a patterned metal layer that may also be patterned to form pads. The second inductor layer comprises metal deposited in a dielectric layer adjacent the patterned metal layer.

13 Claims, 10 Drawing Sheets

(56) References Cited

U.S. PATENT DOCUMENTS

| | | | |
|---|---|---|---|
| 2011/0211321 A1* | 9/2011 | Oikawa | H05K 3/4617 361/782 |
| 2011/0234358 A1* | 9/2011 | Katsumata | H01F 17/0013 336/200 |
| 2012/0212919 A1* | 8/2012 | Mano | H05K 1/185 361/782 |

* cited by examiner

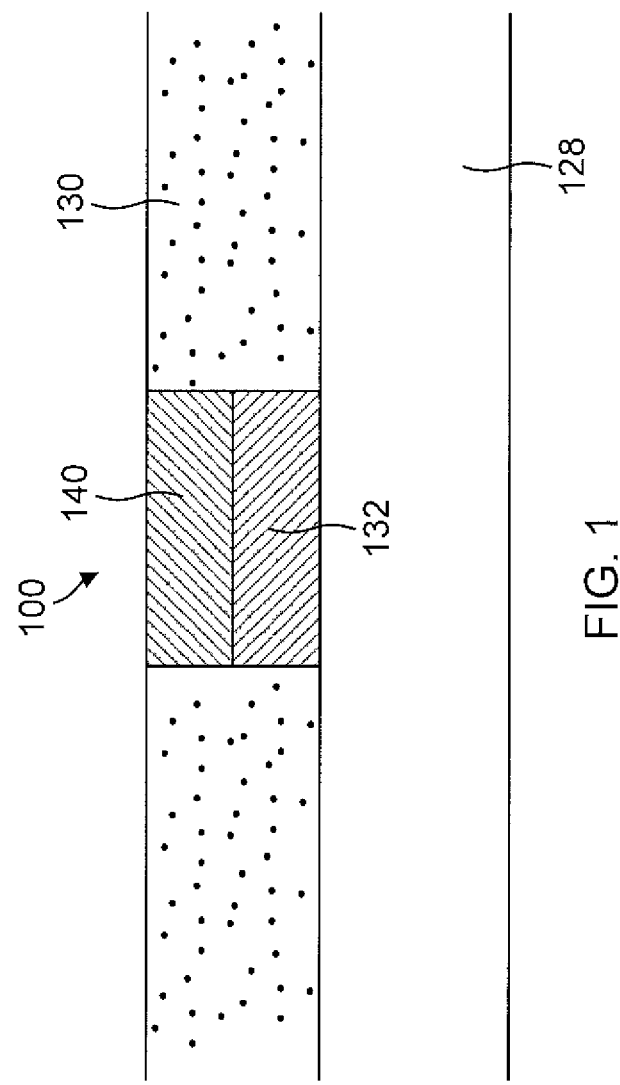

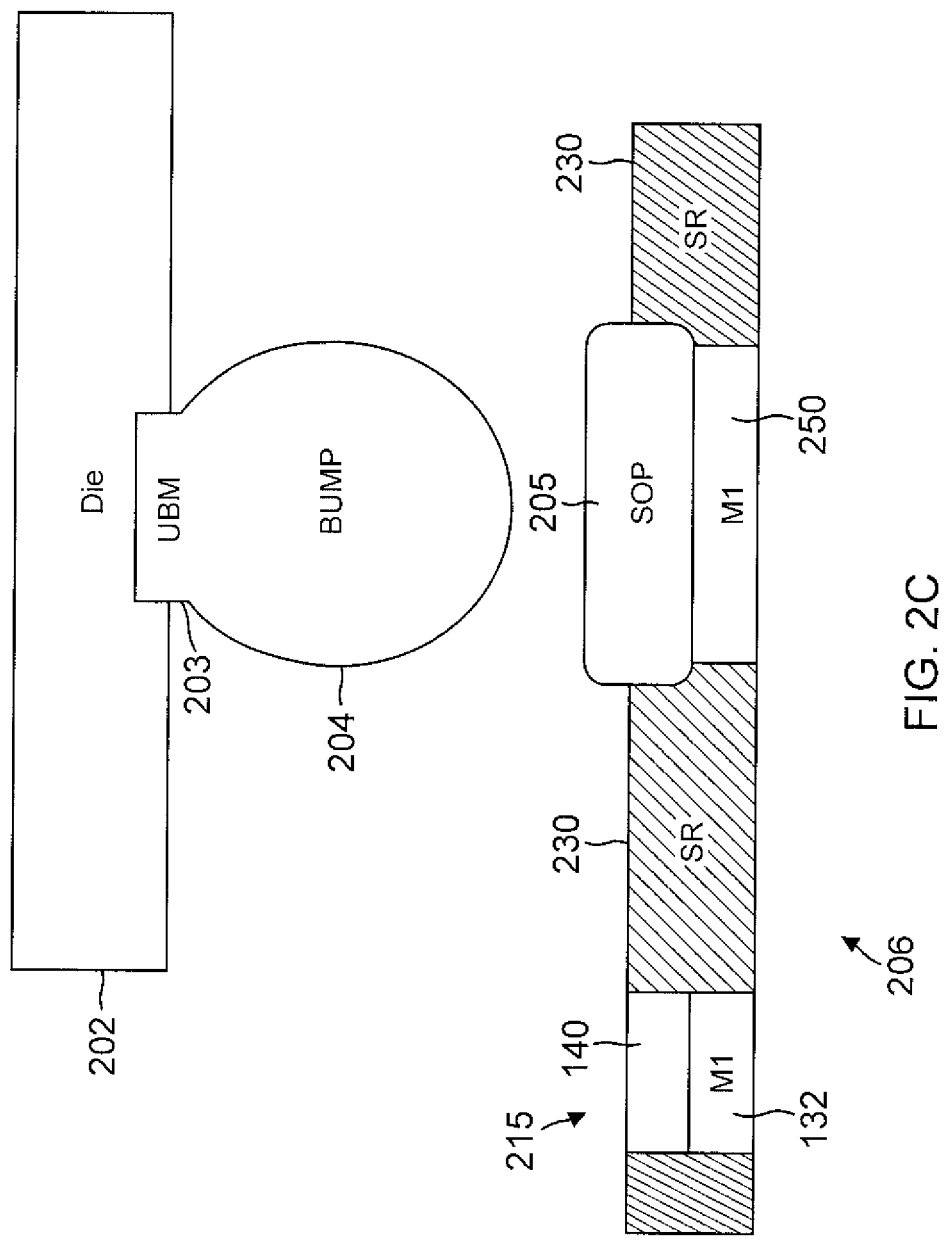

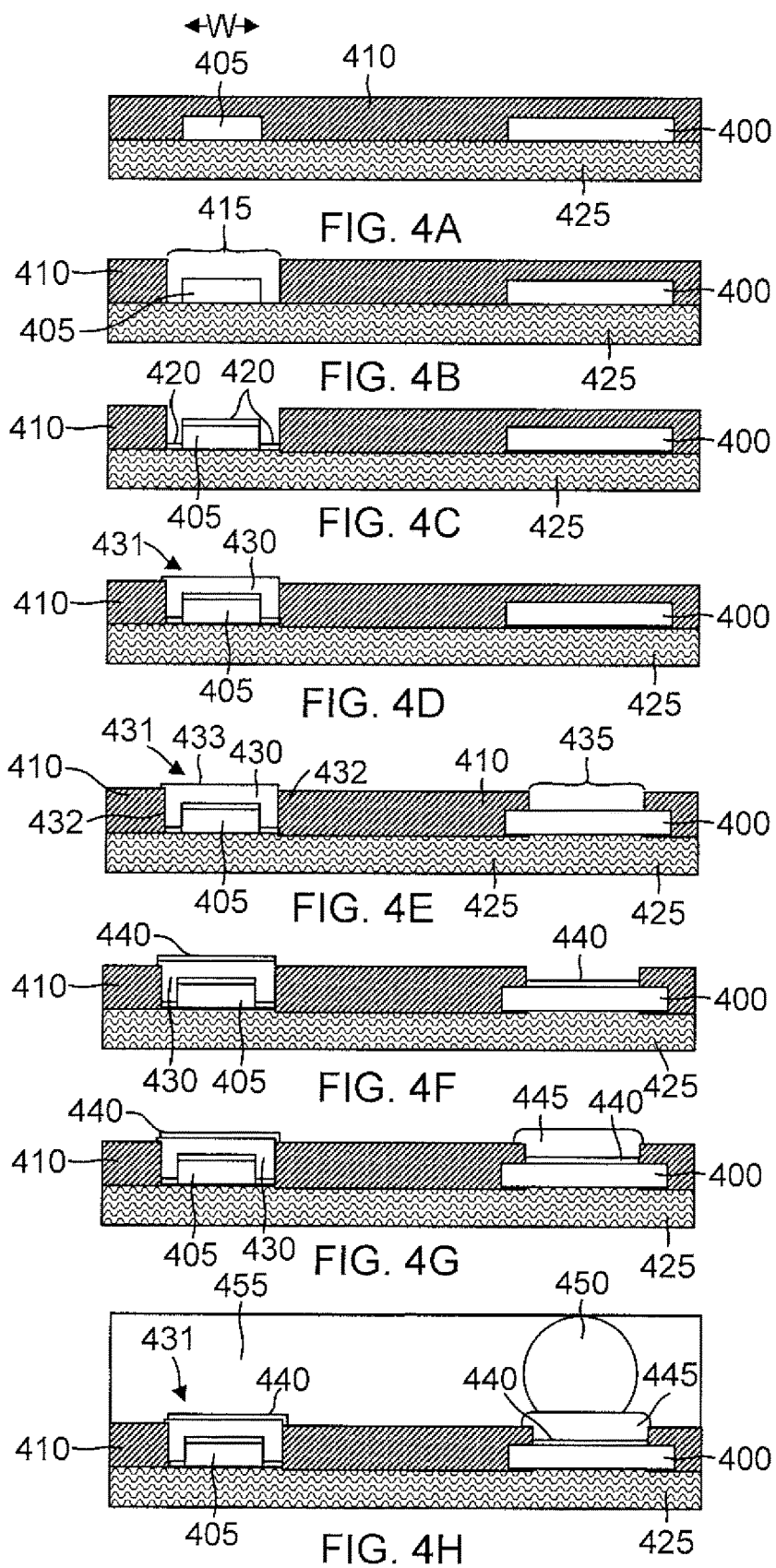

EMBEDDED LAYERED INDUCTOR

TECHNICAL FIELD

This application relates to embedded inductors for an integrated circuit package.

BACKGROUND

High-quality factor (high-Q) inductors improve the performance of RF front end components such as power amplifiers, filters, and diplexers. For example, high-Q inductors increase the efficiency and lower distortion and harmonics for power amplifiers. In addition, high-Q inductors enable lower insertion losses and higher out-of-band rejections in filters and diplexers. Although an RF design may thus require the use of inductors having a quality factor of 50 or greater (or even 70 and greater), the integration of high-Q inductors into a compact integrated circuit package faces a number of challenges. For example, the quality factor for an inductor is inversely related to its DC resistance (Rdc). An inductor having a relatively thick cross-section will have a lower DC resistance than a comparable inductor having a thinner cross-section. To better appreciate why a thicker inductor cross-section provides less DC resistance, consider the water flow produced by a fire hydrant as compared to a household faucet. They are both driven with substantially the same water pressure but the fire hydrant of course provides much greater flow. Similarly, a relative thick wire has less DC resistance than a relatively thin wire made of the same conductive material. It is thus trivial to achieve a high-Q inductor for an RF front end using a discrete conventional inductor for non-mobile applications in which space is not an issue because of the relatively thick conductors used to form such discrete inductors. But there is no space for such bulky discrete inductors in a compact integrated design. One approach is thus to integrate the inductor into the metal layers on the die. But the metal layer thickness in modern CMOS processes is too thin such that the DC resistance of the resulting embedded inductor is relatively high. As a result, the quality factor for die-embedded inductors is limited to approximately ten, which is too low for a high-fidelity RF design.

Embedded inductor designs have also been developed in which the inductor is formed in the metal layer (or layers) for the die package substrate. The quality factor and Rdc of such embedded inductors is dominated by the metal layer thickness as discussed above for die-embedded inductors such that the maximum quality factor is approximately 30 for a package-substrate-embedded inductor at 1.0 Giga-Hertz (GHz). In addition, even if the metal layer thickness could be increased, such thicker layers increase the tolerance needed for their etching. For example, rather than ending up with a desired square or rectangular inductor cross-section, an inductor formed from a relatively-thick etched metal layer may have a more trapezoidal-shaped cross section due to the nature of the metal etching process. One would thus have to design the inductor layout to compensate for the differences between a relatively thick base width and a narrower top width for the inductor cross section. The increased area needed to accommodate the etching error tolerance can thus lead to a need for completely redesigning the patterns for etching devices in a thicker metal layer.

Accordingly, there is a need in the art for improved high-Q embedded inductors for compact integrated circuit packages.

SUMMARY

To provide an embedded inductor with a high quality factor in a compact footprint, an embedded layered inductor is disclosed that includes a first inductor layer and a second inductor layer. As defined herein, an "embedded" inductor is an inductor formed using a metal layer overlaying a substrate. The substrate includes a first dielectric layer that insulates the metal layer. The metal layer is configured such as by being patterned or etched to form the first inductor layer. In some embodiments, this same metal layer may be configured to form additional structures such as a plurality of pads. A second dielectric layer overlaying the metal layer is patterned to form an opening or window exposing the first inductor layer. Metal deposited into the opening in the second dielectric layer forms the second inductor layer. The substrate may comprise a die, a package substrate, or other suitable substrates such as an interposer or a glass substrate. The metal layer may comprise copper, gold, silver, nickel, or other suitable metals. Similarly, the metal deposited to form the second inductor layer may comprise copper, gold, silver, nickel, or other suitable metals.

BRIEF DESCRIPTION OF THE DRAWINGS

FIG. 1 is a cross-sectional view of an embedded layered inductor in accordance with an embodiment of the disclosure.

FIG. 2C is a cross-sectional view of a portion of the package substrate of FIG. 2A showing the embedded layered inductor and a solder-on-pad separated from a corresponding bump on the die.

FIG. 4A is a cross-sectional view of a portion of a package substrate after patterning of a metal layer to form a first inductor layer and deposition of a solder resist layer over the patterned metal layer.

FIG. 4B is a cross-sectional view of the portion of the package substrate from FIG. 4A after patterning the solder resist layer to expose the first inductor layer.

FIG. 4C is a cross-sectional view of the portion of the package substrate from FIG. 4B after deposition of a first surface finish layer over the exposed first inductor layer.

FIG. 4D is a cross-sectional view of the portion of the package substrate from FIG. 4C after deposition of the second inductor layer to form an embedded layered inductor in combination with the first inductor layer.

FIG. 4E is a cross-sectional view of the portion of the package substrate from FIG. 4D after a solder-resist opening is formed in the solder resist layer.

FIG. 4F is a cross-sectional view of the portion of the package substrate from FIG. 4E after deposition of a second surface finish layer.

FIG. 4G is a cross-sectional view of the portion of the package substrate from FIG. 4F after deposition of a solder-on-pad.

FIG. 4H is a cross-sectional view of the portion of the package substrate from FIG. 4F after attachment of a bump and application of underfill.

Embodiments of the present invention and their advantages are best understood by referring to the detailed description that follows. It should be appreciated that like reference numerals are used to identify like elements illustrated in one or more of the figures.

DETAILED DESCRIPTION

Figure 2A:
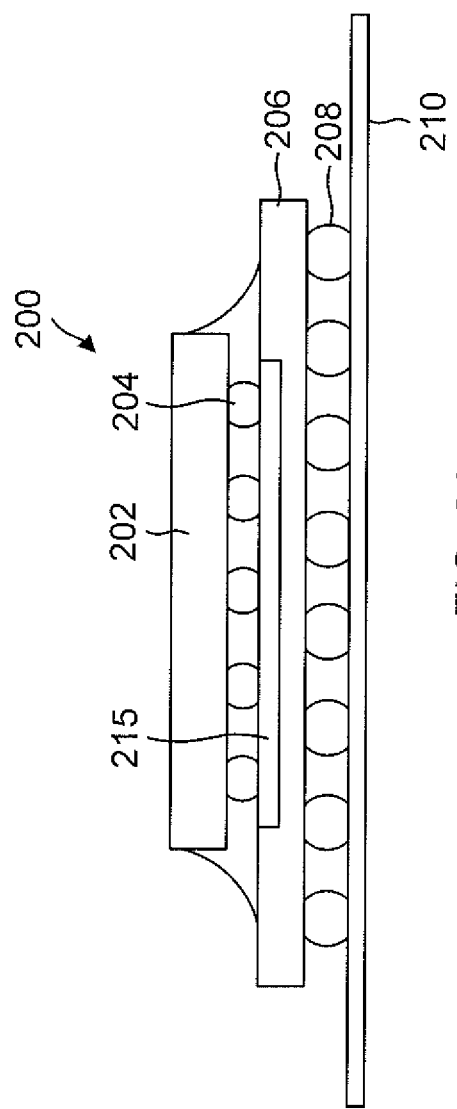
FIG. 2A is a cross-sectional view of an integrated circuit package in which a layered inductor is embedded in the package substrate.

To meet the need in the art for higher quality-factor inductors in an integrated circuit package, a substrate is provided that includes a metal layer patterned to form a first inductor layer for an embedded layered inductor. A first dielectric layer insulates the metal layer from a remainder of the substrate. In addition, a second dielectric layer overlays the metal layer. A second inductor layer is formed within the second dielectric layer to complete the embedded layered inductor. In one embodiment, the substrate comprises a package substrate such as an organic substrate. Alternatively, the substrate may comprise a semiconductor substrate (a die) or other types of substrates such as an interposer or a glass substrate. Similarly, the second dielectric layer may comprise a wide variety of suitable dielectric materials such as solder resist or passivation materials.

Overview

Turning now to the drawings, FIG. 1 shows an example embedded layered inductor 100 comprising a first inductor layer 132 and a second inductor layer 140. The combination of first inductor layer 132 and second inductor layer 140 provides a sufficiently-thick cross section for embedded layered inductor 100 so as to lower its DC resistance and thus provide a high-quality factor. As will be explained further herein, first inductor layer 132 is formed from a metal layer (not illustrated) that is patterned such as through etching. First inductor layer 132 thus has the same thickness as the metal layer from which it was formed in some embodiments. In that regard, the metal layers in modern semiconductor packaging are typically far too thin and thus too resistive to form high-quality embedded inductors. But such relatively thin metal layers can be patterned with high precision. As discussed earlier, the etching of thick metal layers leads to a trapezoidal cross-section in the resulting inductor cross section that increases the tolerance in the inductor shape or layout. It is thus undesirable to simply increase the metal layer thickness to achieve high-quality factor inductors as the resulting tolerances will be generally poor. However, first inductor layer 132 (and thus the metal layer from which it is formed) can be relatively thin yet embedded layered inductor 100 has a relatively high quality factor because of the presence of second inductor layer 140.

In general, substrates such as package substrates, semiconductor substrates, interposers, and glass substrates may support one or more metal layers on its surface. These metal layers are insulated by corresponding dielectric layers. In FIG. 1, a first dielectric layer 128 overlays a substrate (not illustrated) and insulates the metal layer forming first inductor layer 132 from the substrate. A second dielectric layer 130 surrounds the sidewalls of embedded layered inductor 100. As will be explained further herein, second dielectric layer 130 is deposited over first inductor layer 132. Second dielectric layer 130 would thus initially encapsulate and overlay first inductor layer 132. To enable the formation of second inductor layer 140, second dielectric layer 130 may then be patterned to form an opening or window (not illustrated) that exposes first inductor layer 132. Deposition of metal into this opening in second dielectric layer 130 forms second inductor layer 140 to complete the formation of embedded layered inductor 100. Second dielectric layer 130 may then be removed in some embodiments.

Note that the combined thicknesses of first inductor layer 132 and second inductor layer 140 is such that the effective DC resistance of embedded layered inductor 100 is relatively low so as to provide a high quality factor. This is quite advantageous because if one were to merely increase the thickness of the metal layer patterned to form first inductor layer 132 so as to achieve the same high quality factor and low resistance, the patterning of such a relatively thick metal layer would have poor tolerances as discussed above. But embedded layered inductor 100 may be formed with high precision in that first inductor layer 132 may be relatively thin. Similarly, the patterning of second dielectric layer 130 does not suffer from the irregular cross-sections that are produced when etching metal layers. Thus the opening formed in second dielectric layer 130 into which second inductor layer 140 will be deposited may be formed with high precision, which then leads to high precision in the formation of second inductor layer 140. Accordingly, embedded layered inductor 100 is thick enough to provide a high quality factor yet may be formed with high precision and tight tolerances. The high quality factor for embedded layered inductor 100 leads to increased voltage headroom, improved high-power-added efficiency (PAE) and gain, lower distortion and decreased harmonics, lower insertion loss, and better out-of-band rejection for RF front end components as compared to the use of conventional embedded inductors. In addition, the integrated circuit package size and production costs can be decreased accordingly.

One can readily appreciate that the preceding description of embedded layered inductor 100 is independent of the type of substrate on which it is embedded. As discussed earlier, the substrate may comprise a wide variety of forms such as an organic substrate, a semiconductor substrate, an interposer, or a glass substrate. A package substrate embodiment will now be discussed in more detail followed by a discussion of a die-embedded embodiment.

Package Substrate Embodiments

FIG. 2A illustrates a flip-chip package 200 in accordance with one or more embodiments. Package 200 includes an integrated circuit die 202 and a package substrate 206 such as an organic package substrate. Die 202 electrically (and mechanically) interconnects with package substrate 206 by means of solder bumps 204 as known in the flip-chip packaging arts. Alternatively bumps 204 may be replaced by copper pillars or other suitable interconnects, More generally, package 200 includes a means for conductively interconnecting die 202 to package substrate 206 such as through the use of bumps 204 (e.g., solder bumps, or copper pillars). Package substrate 206 couples to a printed circuit board 210 via solder balls 208. A layered high-Q inductor 215 is embedded in package substrate 206 as discussed further herein.

Figure 2B:
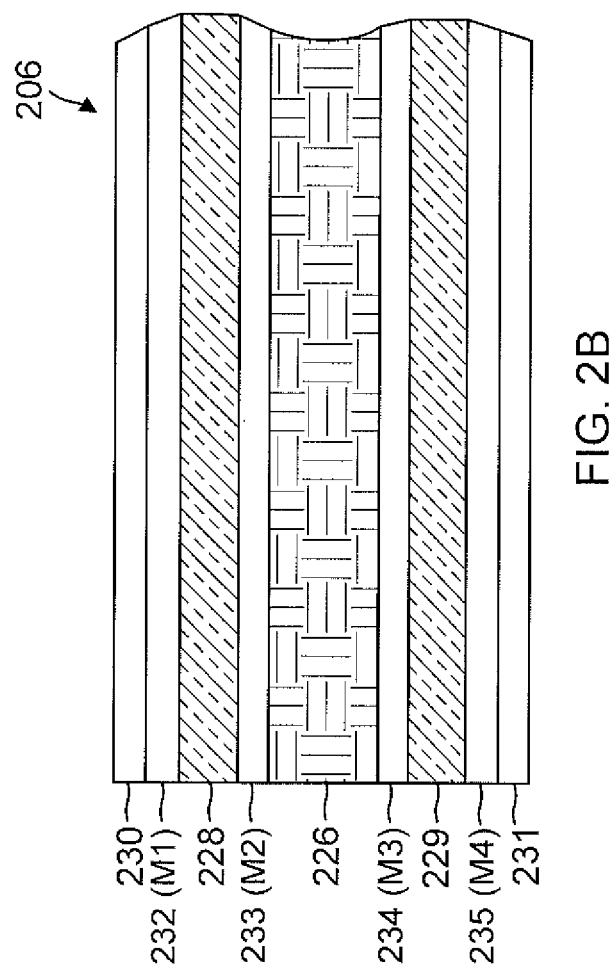
FIG. 2B is a cross-sectional view of the package substrate of FIG. 2A prior to formation of an embedded layered inductor.

The following discussion will be directed to a solder-on-pad (SoP) package substrate embodiment. However, it will be appreciated that the concepts and features discussed herein are readily adapted to package substrate embodiments that do not include SoPs. To better appreciate the advantageous features of inductor 215, the composition of a typical organic substrate such as package substrate 206 is shown in more detail in FIG. 2B. For illustration clarity, FIG. 2B illustrates the layers within package substrate 206 prior to the various patterning and deposition steps described herein. Package substrate 206 includes a plurality of metal layers such as an M1 metal layer 232, an M2 metal layer 233, an M3 metal layer 234, and an M4 metal layer 235. These metal layers may each be relatively thin—for example, in one embodiment, each metal layer may be approximately 18 microns in thickness. The metal layers may comprise copper, nickel, or other suitable metals such as gold or silver. Package substrate 206 also includes a core 226 which may comprise, for example, an organic material. A first dielectric layer 228 insulates M1 metal layer 232 from M2 metal layer 233. In general, as will be the case for all dielectric layers discussed herein, first dielectric layer 228 may comprise a wide variety of suitable insulating materials such as a resin or pre-impregnated (prepreg) epoxy. Similarly, a dielectric layer 229 such as a prepreg layer insulates M3 metal layer 234 from M4 metal layer 235. A second dielectric layer 230 such as a solder resist layer overlays M1 metal layer 232. A board-facing surface of package substrate 206 includes a solder resist layer 231 adjoining M4 metal layer 235.

More generally, alternative package substrate embodiments may include just one metal layer on either side of a core layer or a plurality of metal layers greater than two on either side of a core layer. The following discussion concerns the patterning of M1 layer 232 to form first inductor layer 132 but it will be appreciated that other metal layers could be patterned in this fashion. Regardless of which metal layer is patterned to form a first inductor layer, it may comprise a relatively thin metal layer that would otherwise have too high of a DC resistance to form a high-Q embedded inductor. Conversely, such a relatively thin metal layer may be patterned with high precision as discussed above. The result of patterning such a relatively thin metal layer into a first inductor layer would thus provide (without any additional layers) a low-Q embedded inductor that is formed with high precision. As will be explained further herein, the deposition of a second inductor layer onto the first inductor layer provides both high precision in the resulting shape of the embedded layered inductor as well as a high quality factor. It will thus be appreciated that while the following discussion is directed to the patterning of M1 layer 232 to form first inductor layer 132, other metal layers could have been patterned in this fashion.

Dielectric layer 228 (FIG. 2B), which insulates M1 metal layer 232 from remaining layers of substrate 206 is denoted herein as a "first dielectric layer" to distinguish it from dielectric layer 230 that overlays M1 metal layer 232. A dielectric layer such as dielectric layer 230 that overlays an M1 metal layer is denoted herein as a "second dielectric layer" to distinguish it from the first dielectric layer that underlays the M1 metal layer. Referring again to FIG. 1, one can thus appreciate that second dielectric layer 230 is an example of second dielectric layer 130 whereas first dielectric layer 228 is an example of first dielectric layer 128.

As discussed earlier, the following discussion is directed to a solder-on-pad (SoP) package substrate embodiment such that second dielectric layer 230 comprises a solder resist layer. However, it will be appreciated that second dielectric layer 230 may comprise other types of suitable dielectric materials. Referring again to FIG. 2A, bumps 204 for die 202 couple through corresponding SoPs (not illustrated) to package substrate 206. To form package 200, die 202 is placed onto package substrate 202 such that the bumps 204 align with the corresponding SoPs on package substrate 200. The resulting placement is then reflowed to complete package 200. Such a placement is partially shown in FIG. 2C, which illustrates an SoP 205 about to receive a corresponding bump 204 from die 202. Die 202 may include an under bump metallization (UBM) 203 for coupling to bump 204.

In a solder-on-pad embodiment, metal layer M1 232 is patterned to form a plurality of pads. For example, metal layer M1 232 has been patterned to form a plurality of pads such as a pad 250 as shown in FIG. 2C. Solder resist layer 230 is deposited over pad 250 and then patterned to form a solder resist opening (SRO) exposing pad 250. Solder may then be deposited into the SRO to complete solder-on-pad (SoP) 205.

The formation of embedded layered inductor 215 (FIG. 2A) may advantageously exploit pre-existing features of a SoP package substrate such as package substrate 206 as follows. To exploit the SoP features of package substrate 206, metal layer M1 232 is not only patterned to form pads but also to form first inductor layer 132 as shown in the cross-sectional view of FIG. 2C. In alternative embodiment, however, metal layer M1 232 need not be patterned into additional structures besides first inductor layer 132.

Figure 3A:
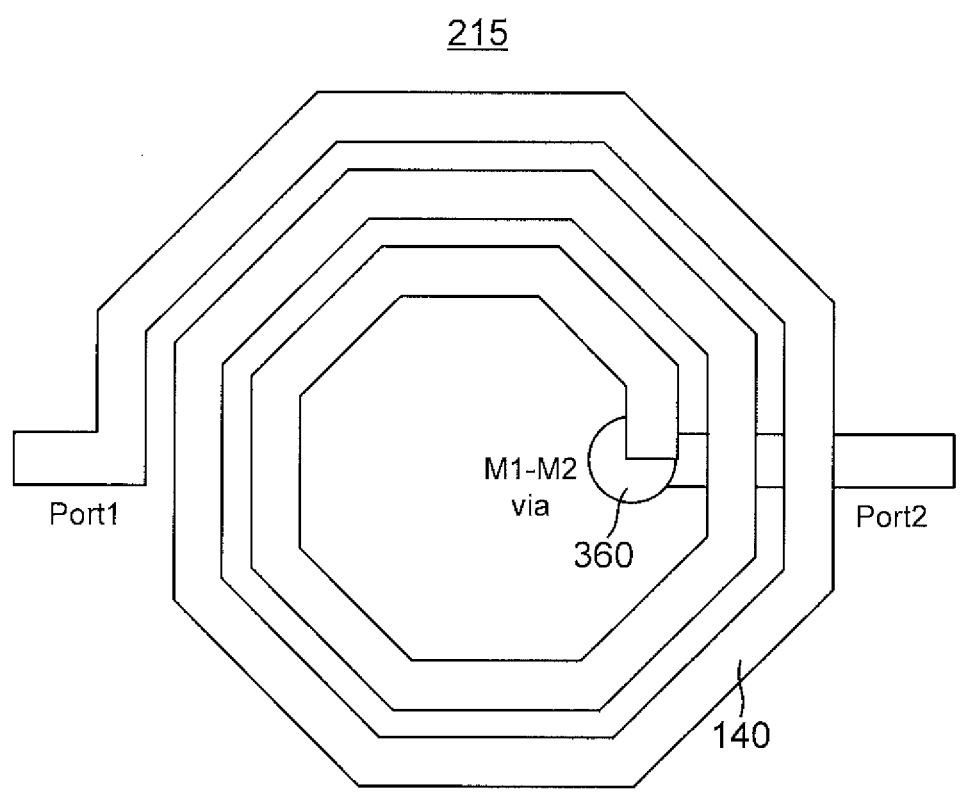
FIG. 3A is a plan view of the layered inductor of FIG. 2A in accordance with an embodiment of the disclosure.
Figure 3B:
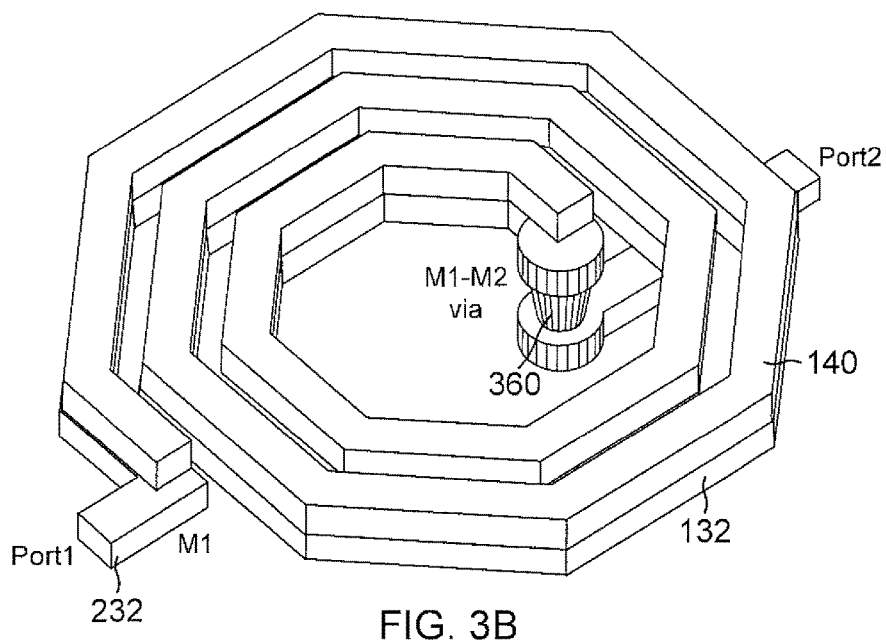
FIG. 3B is a perspective view of the layered inductor of FIG. 3A.
Figure 3C:
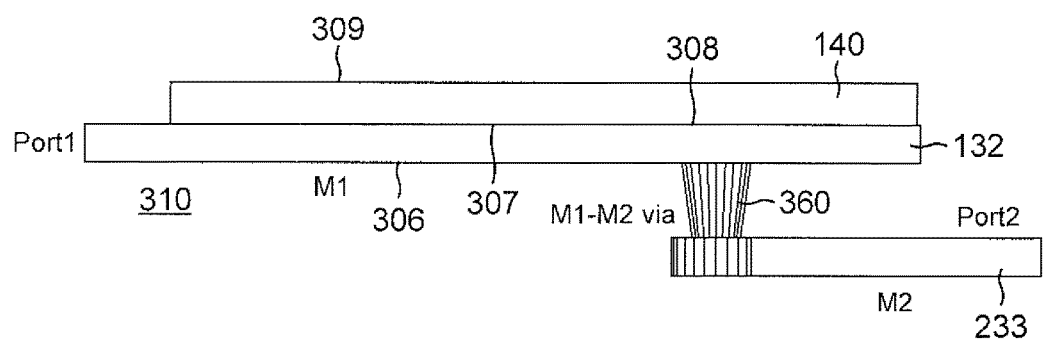
FIG. 3C is a cross-sectional view of the layered inductor of FIG. 3A.

Embedded layered inductor 215 forms one or more loops so that it may generate magnetic flux in response to current flow. It will be appreciated that the number of loops formed by embedded layered inductor 215 is a design choice and depends upon the particular application. For example, a two and one-half loop embodiment for embedded layered inductor 215 is shown in FIG. 3A, FIG. 3B and FIG. 3C. FIG. 3A is a plan view of layered inductor 215 such that first inductor layer 132 is hidden beneath second inductor layer 140. For illustration clarity, FIGS. 3A, 3B, and 3C show only embedded layer inductor 215 and its ports 1 and 2 such that the remaining elements of package substrate 206 are not illustrated. As will be explained further herein, solder resist layer 230 of FIG. 2B is deposited over first inductor layer 132 and then patterned to form SROs and also to form an opening or window exposing first inductor layer 132 for the subsequent deposition of second inductor layer 140. Metal such as nickel or copper may then be deposited into this solder resist layer opening or window to complete the formation of second inductor layer 140.

To provide the desired inductance in a relatively small footprint on package substrate 206, layered inductor 215 may include several concentric loops or turns. The shape of the loop (or loops) for embedded layered inductor 215 is denoted herein as its "layout." As noted earlier, the layout illustrated in FIGS. 3A-3C for embedded layered inductor 215 forms two and one-half loops. First inductor layer 132 thus has a layout forming substantially the same two and one-half loops. Similarly, second inductor layer 140 has a layout forming substantially the same two and one-half loops. In general, the number of loops, their diameters, and their cross-sectional width depends upon the desired RF behavior for embedded layered inductor 215 and can be widely varied from the particular layout shown in FIGS. 3A-3C.

Second inductor layer 140 is electroplated or otherwise deposited into a solder resist layer opening exposing first inductor layer 132. Inductor layers 140 and 132 are thus metallically bonded together to form layered inductor 215. As seen best in the cross-sectional view of FIG. 3C, first inductor layer 132 has a first surface 306 that adjoins first dielectric layer 228 (shown in FIG. 2B). Similarly, first inductor layer 132 has an opposing second surface 307 that faces second inductor layer 140. Since second inductor layer 140 is deposited over second surface 307 of first inductor layer 132, second inductor layer 140 includes a first surface 308 that faces and adjoins second surface 307 of first inductor layer 132. Finally, second inductor layer 140 includes an opposing second surface 309 that faces die 202 (shown in FIG. 2A). Layered high-Q inductor 215 will thus have sidewalls that extend from second surface 309 of second inductor layer 140 to first dielectric layer 228 (FIG. 2B). Second dielectric layer 230 (not illustrated in FIG. 3A-3C) surrounds or encases these sidewalk.

Embedded inductor 215 may be driven through a pair of terminals that are denoted in FIGS. 3A-3C as ports 1 and 2. In one embodiment, since first inductor layer 132 is formed from metal layer M1 232 of FIG. 2B, it is convenient to pattern metal layer M1 232 to form ports 1 and port 2 as opposed to using other metal layers, which would then need vias to couple to first inductor layer 132. In another embodiment, if the layout of an embedded layered inductor includes multiple loops such as shown for embedded layered inductor 215, then both ports cannot be formed solely in metal layer M1 232. This is best seen in FIG. 3A for port 2, which would have to short across the two outer loops to couple to the end of the inner loop for embedded layered inductor 215. Thus, port 2 may be formed by patterning another metal layer such as metal layer M2 233. As best shown in FIG. 3C, a via 360 thus couples between metal layer M2 233 and first inductor layer 132 to complete port 2. Via 360 is formed using the same processes to form analogous vias between metal layers in package substrate 206. In that regard, package substrate 206 requires numerous vias between its metal layers as otherwise signals could not conduct through package substrate 206 to couple die 202 of FIG. 2A to external devices (not illustrated). In contrast to port 2, port 1 may be formed by merely patterning metal layer M1 232 since this same metal layer is patterned to form first inductor layer 132. In one embodiment, ports 1 and 2 comprise a means for coupling embedded layered inductor 215 to external devices. For example, an RF frontend in die 202 of FIG. 2A may couple through ports such as ports 1 and 2 to embedded layered inductor 215.

An example method of manufacturing will now be discussed including illustrations of various steps in the manufacturing process.

Example Methods of Manufacture for Package Substrate Embodiments

FIG. 4A through FIG. 4H illustrates manufacturing steps for forming an embedded layered high-Q inductor such as inductor 215 of FIGS. 3A-3C. In FIG. 4A, an M1 metal layer has been patterned to form a pad 400 such as a pad for a subsequent formation of a solder-on-pad and also to form a first inductor layer 405. For example, the M1 metal layer may comprise a relatively thin copper metal layer having a thickness of approximately 20 microns. Pad 400 and first inductor layer 405 have the same thickness accordingly. As shown in the cross-sectional view of FIG. 4A, first inductor layer 405 has a width W. A second dielectric layer 410 such as a solder resist layer is then deposited over the patterned M1 metal layer and thus over pad 400 and first inductor layer 405. In FIG. 4B, second dielectric layer 410 is patterned to form an opening 415 for deposition of the metal used subsequently to form the second inductor layer. Opening 415 may have a slightly wider cross-section as compared to the width W of inductor layer 405 so as to account for tolerances and completely expose first inductor layer 405. In other embodiments, opening 415 may have the same cross-sectional width or even a smaller width as compared to width W of first inductor layer 405. However, making opening 415 wider than first inductor layer 405 provides tolerance for variances in the width W of first inductor layer 405.

FIG. 4C illustrates the deposition of a first surface finish such as a nickel-gold surface finish 420 onto the exposed surface of first inductor layer 405 to prepare for the subsequent electroplating of the second inductor layer. As known in the semiconductor arts, a surface finish layer such as surface finish 420 prevents oxidation of first inductor layer 405. For example, copper is an active metal so it will quickly oxidize unless protected by a suitable surface finish. Since opening 415 was wider than the width W of first inductor layer 405, surface finish 420 also covers the exposed surface of a first dielectric layer 425 such as a prepreg layer or other dielectric material insulating the M1 metal layer. FIG. 4D illustrates the electroplating of a suitable metal such as copper or nickel to deposit a second inductor layer 430 over surface finish 420 to fill opening 415 with metal. In combination, first inductor layer 405 and second inductor layer 430 form an embedded layered high-Q inductor 431. Since opening 415 was wider than the width W for first inductor layer 415, second inductor layer 430 encases or at least partially overlaps first inductor layer 405. In that regard, second inductor layer 430 has a thickness that varies due to the overlapping of the sides of first inductor layer 405. Since second inductor layer 430 may be configured with the same width as first inductor layer 405 (or even a smaller width), the "thickness" of second inductor layer 430 is defined herein only with regard to the portion that overlays first inductor layer 405 as opposed to those portions of second inductor layer 430 that overlay only the exposed portions of first dielectric layer 425. Given such a definition, the thickness of embedded layered inductor 431 substantially equals a sum of the thickness of first inductor layer 405 and the thickness of second inductor layer 430.

FIG. 4E illustrates the patterning of second dielectric layer 410 to form an opening such as an SRO 435 to expose a portion of pad 400. FIG. 4F illustrates the deposition of a second surface finish 440 over an exposed surface of second inductor layer 430 and pad 400. As discussed earlier, such a surface finish layer protects second inductor layer 430 and pad 400 from oxidation. As shown in FIG. 4G, solder is deposited into SRO 435 (FIG. 4E) to overfill SRO 435 to form an SoP 445. A bump 450 and underfill 455 may then be applied to complete an integrated circuit package as illustrated in FIG. 4H. For illustration clarity, a die is not shown coupling to bump 450 but would be coupled through bump 450 analogously as shown for bumps 204 of die 202 in FIG. 2A.

As annotated in FIG. 4E, embedded layered inductor 431 includes sidewalls 432 that extend from first dielectric layer 425 to an opposing first surface 433 of second inductor layer 430. Second dielectric layer 410 thus surrounds sidewalls 432 of embedded layered inductor 431. In one embodiment, second dielectric layer 410 has a thickness that substantially equals a thickness of embedded layered inductor 431. The ports for embedded layered inductor 431 are not shown in FIGS. 4A-4H but would be formed analogously as discussed with regard to the formation of ports 1 and 2 of FIGS. 3A-3C.

Example Method of Manufacture for Die Embodiments

Figure 5A:
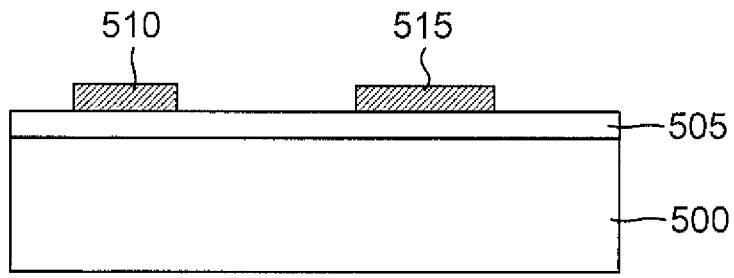
FIG. 5A is a cross-sectional view of a die with a metal layer patterned to form pads and a first inductor layer.
Figure 5B:
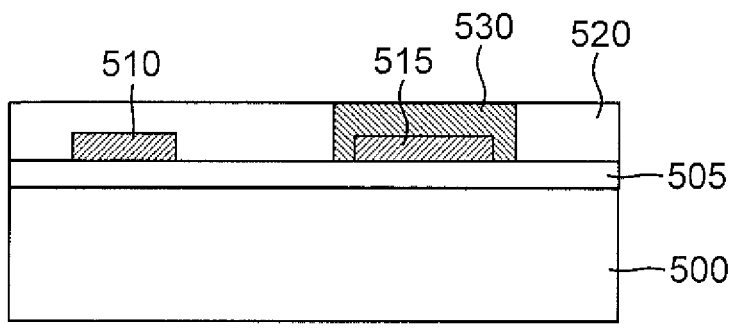
FIG. 5B is a cross-sectional view of the die of FIG. 5A after deposition of a dielectric layer and a second inductor layer.
Figure 5C:
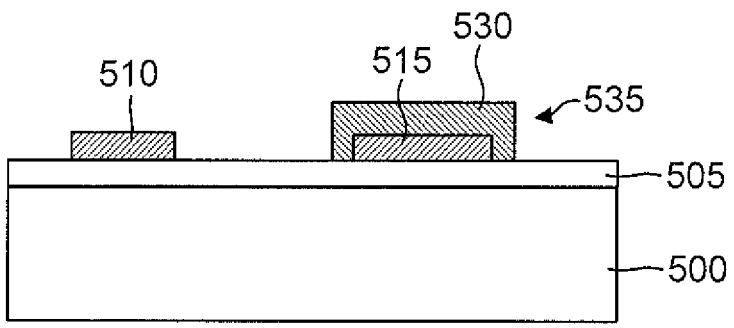
FIG. 5C is a cross-sectional view of the die of FIG. 5B after removal of the dielectric layer to expose the layered inductor.

It will readily appreciated that the manufacturing process discussed with regard to FIGS. 4A through 4H may be adapted for the formation of an embedded layered inductor on a semiconductor substrate for an integrated circuit (a die) or on other suitable types of substrates such as interposers or glass substrates. In that regard, embedded layered inductor 100 of FIG. 1 is independent of the type of substrate that first dielectric layer 128 overlays. In a die embodiment, first dielectric layer 128 overlays a die's semiconductor substrate. For example, as shown in FIG. 5A a first dielectric layer 505 overlays a die substrate 500. A metal layer overlaying first dielectric layer 505 is patterned to form pads such as a pad 510 and also to form a first inductor layer 515. Such a metal layer is thus analogous to metal layer M1 233 although other metal layers may be used to form first inductor layer 515. In general, die 500 may include additional metal layers insulated by corresponding dielectric layers but these additional layers are not shown for illustration clarity. In FIG. 5B, a second dielectric layer 520 is deposited over pad 510 and first inductor layer 515 and patterned to form an opening exposing first inductor layer 515. Second dielectric layer 520 may comprise a die passivation layer such as a silicon dioxide, silicon nitride, silicon oxynitride, or other suitable dielectric materials. Metal deposited in the opening in second dielectric layer 520 such as through electroplating forms a second inductor layer 530. This deposition of metal may be preceded by formation of a surface finish layer (not illustrated) over first inductor layer 515 analogously as discussed with regard to FIG. 4B. As shown in FIG. 5C, second dielectric layer 520 may then be removed to reveal a resulting layered inductor 535. In addition, second dielectric layer 520 may be protected by a surface finish layer (not illustrated) analogously as discussed with regard to FIG. 4F.

Method of Manufacturing Flowchart

Figure 6:
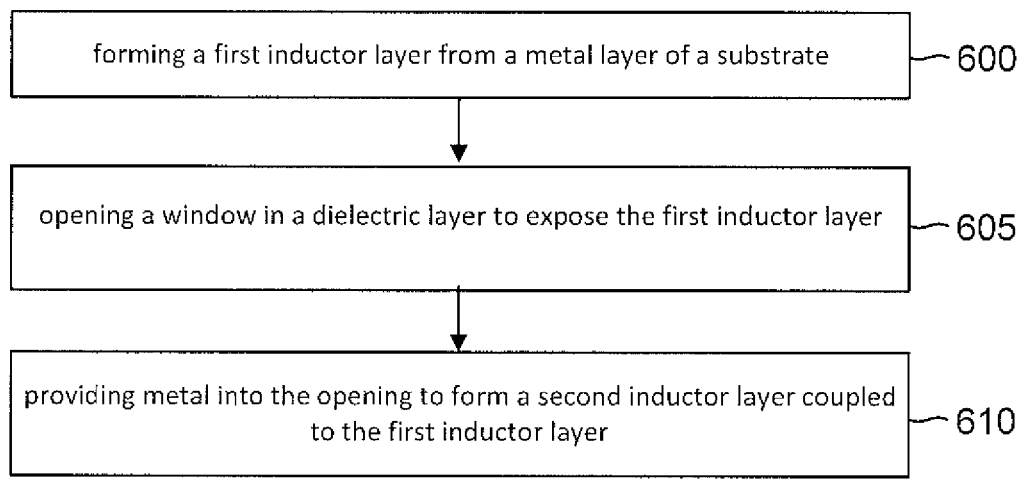
FIG. 6 is a flowchart for a method of manufacture for an embedded layered inductor in accordance with an embodiment of the disclosure.

A manufacturing process generic to the various embodiments discussed herein may be summarized as shown in a flowchart of FIG. 6. A first step 600 comprises forming a first inductor layer from a metal layer for a substrate. An example of this metal layer would be M1 232 of FIG. 2B through FIG. 3C and also the metal layer used to form pad 510 and first inductor layer 515 of FIG. 5A. A second step 605 comprises forming an opening in a dielectric layer to expose the first inductor layer. Such a dielectric layer is referred to as the second dielectric layer in the embodiments discussed above. Finally, the process includes a step 610 of providing metal into the opening to form a second inductor layer coupled to the first inductor layer. For example, the metal may be electroplated into the opening as discussed above with regard to the formation of second inductor layer 140, 430, and 530.

Example Electronic Systems

Figure 7:
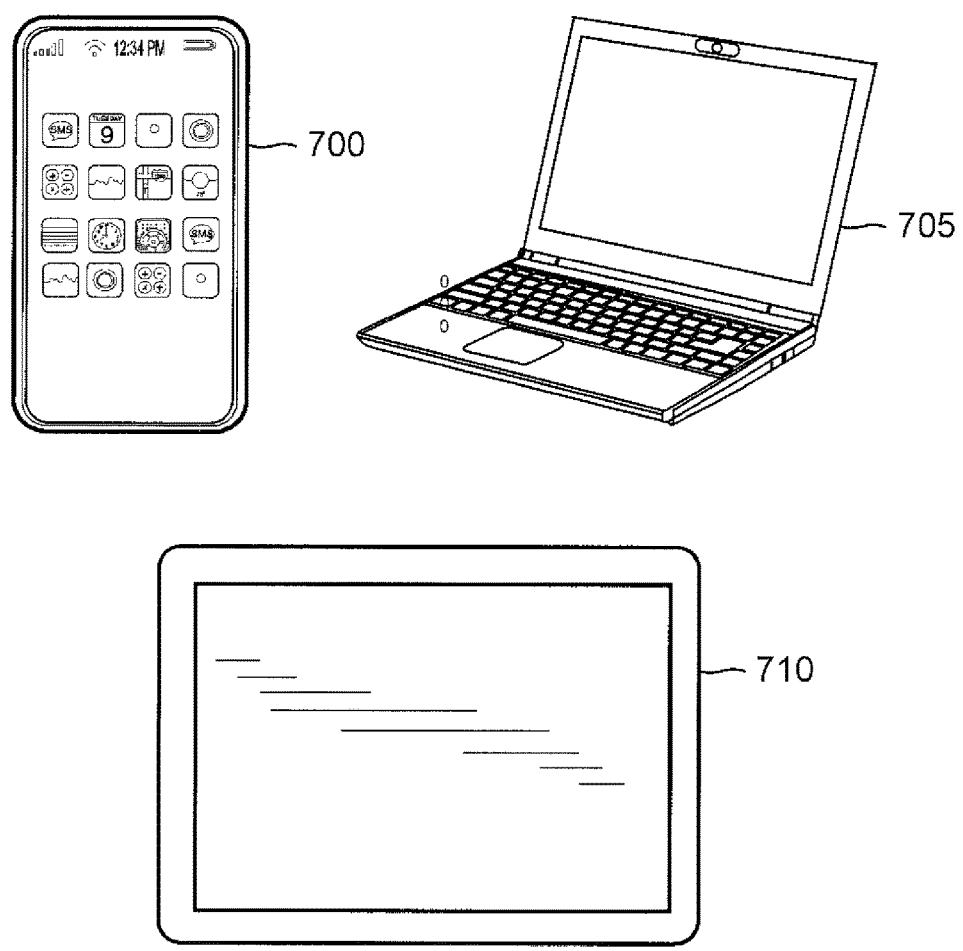
FIG. 7 illustrates some example electronic systems incorporating an interposer package in accordance with an embodiment of the disclosure.

Integrated circuit packages including an embedded layered inductor as disclosed herein may be incorporated into a wide variety of electronic systems. For example, as shown in FIG. 7, a cell phone 700, a laptop 705, and a tablet PC 710 may all include an integrated circuit package incorporating an embedded layered inductor constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A substrate, comprising:
a first dielectric layer;
a first metal layer proximate to the first dielectric layer, wherein the first metal layer forms a first inductor layer comprising a first sidewall and a second sidewall opposite the first sidewall;
a second inductor layer directly metallically bonded to the first inductor layer, the second inductor layer comprising a first sidewall and a second sidewall opposite the first sidewall, wherein the first inductor layer and the second inductor layer form a layered inductor such that the first sidewall of the first inductor layer is vertically aligned with the first sidewall of the second inductor layer and the second sidewall of the first inductor layer is vertically aligned with the second sidewall of the second inductor layer and extends to the first dielectric layer, and
a second dielectric layer surrounding the first sidewall of the first inductor layer, the first sidewall of the second inductor layer, the second sidewall of the first inductor layer, and the second sidewall of the second inductor layer of the layered inductor,
wherein the substrate includes a package substrate; and
wherein the second dielectric layer includes a solder resist layer with a thickness that extends from the first dielectric layer, that substantially equals a thickness of the layered inductor.

2. The substrate of claim 1, wherein the layered inductor has a quality factor of at least fifty.

3. The substrate of claim 1, wherein the layered inductor has a quality factor of at least seventy.

4. The substrate of claim 1, wherein the second inductor layer has a width greater than a width of the first inductor layer, the second inductor layer comprises a portion proximate the first dielectric layer.

5. The substrate of claim 1, wherein the first metal layer further forms a plurality of pads for a plurality of corresponding solder-on-pads, the substrate included in an integrated circuit package that further comprises a die coupled to the plurality of corresponding solder-on-pads through a corresponding plurality of interconnects.

6. The substrate of claim 1, wherein the substrate comprises a semiconductor substrate, and wherein the second dielectric layer comprises a passivation layer.

7. The substrate of claim 1, wherein the substrate is incorporated into at least one of a cellphone, a laptop, a tablet, a music player, a communication device, a computer, and a video player.

8. The substrate of claim 1, further comprising:
means for coupling the layered inductor to external devices.

9. The substrate of claim 5, wherein the first metal layer further forms a first port for the layered inductor.

10. The substrate of claim 5, wherein the die includes an RF front end coupled to the layered inductor.

11. The device of claim 8, wherein the first metal layer further forms a first port, and wherein the means for coupling comprises the first port.

12. The device of claim 8, wherein the substrate further includes a second metal layer that forms a second port, and wherein the means for coupling further comprises the second port.

13. The substrate of claim 9, further comprising a second metal layer that forms a second port for the layered inductor, the substrate includes a via that couples the second port to the first inductor layer.

* * * * *